United States Patent [19]
Loeppert et al.

[11] Patent Number: 5,870,482
[45] Date of Patent: Feb. 9, 1999

[54] MINIATURE SILICON CONDENSER MICROPHONE

[75] Inventors: Peter V. Loeppert, Hoffman Estates; David E. Schafer, Glen Ellyn, both of Ill.

[73] Assignee: Knowles Electronics, Inc., Itasca, Ill.

[21] Appl. No.: 805,983

[22] Filed: Feb. 25, 1997

[51] Int. Cl.$^6$ .................................................. H04R 25/00
[52] U.S. Cl. .......................................... 381/174; 381/191
[58] Field of Search ..................................... 381/170, 174, 381/191, 113, 116, 173; 29/25.41, 594; 367/181; 73/517 R, 862.59; 437/209

[56] References Cited

U.S. PATENT DOCUMENTS

| | | | |
|---|---|---|---|
| 3,626,096 | 12/1971 | von Muench et al. | 179/1 R |
| 3,772,133 | 11/1973 | Schmitt | 116/112 |
| 3,991,285 | 11/1976 | Van Den Worm et al. | 179/111 E |
| 4,491,697 | 1/1985 | Tanaka et al. | 179/111 E |
| 4,542,264 | 9/1985 | Schmidt et al. | 179/111 |
| 4,571,661 | 2/1986 | Hoshino . | |
| 4,651,120 | 3/1987 | Aagard | 338/4 |
| 4,771,638 | 9/1988 | Sugiyama et al. | 73/721 |
| 4,783,821 | 11/1988 | Muller et al. | 381/173 |
| 4,993,072 | 2/1991 | Murphy | 381/113 |
| 5,146,435 | 9/1992 | Bernstein | 367/181 |
| 5,151,763 | 9/1992 | Marek et al. . | |
| 5,188,983 | 2/1993 | Guckel et al. | 437/209 |
| 5,208,789 | 5/1993 | Ling | 367/181 |
| 5,228,341 | 7/1993 | Tsuchitani et al. | 73/517 R |
| 5,452,268 | 9/1995 | Bernstein | 367/181 |
| 5,490,220 | 2/1996 | Loeppert | 381/168 |

FOREIGN PATENT DOCUMENTS

| | | |
|---|---|---|
| 03 341 964 | 11/1989 | European Pat. Off. . |
| 0561566 A3 | 9/1993 | European Pat. Off. . |
| A 220 2800 | 10/1990 | Japan . |
| 0561566 A2 | 9/1993 | WIPO . |
| WO 95/34917 | 12/1995 | WIPO . |

OTHER PUBLICATIONS

D. Hohm and G. Hess, "A Subminiature Condenser Microphone with Silicon Nitride Membrane and Silicon Back Plate," *J. Acoust. Soc. Am.* 85(*1*), (Jan. 1989) pp. 476–480.

J. Bergqvist and F. Rudolf, "A Silicon Condenser Microphone with a Highly Perforated Backplate," *Transducers '91—1991 Int'l Conf. on Solid State Sensors and Activators, IEEE* (1991) pp. 266–269.

G.M. Sessler, "Acoustic Sensors," *Sensors and Actuators A.* 25–27 (1991) pp. 323–330 Technical University of Darmstadt, Darmstadt (F.R.G.).

W. Kuhnel, G. Hess, "Micromachined Subminiature Condenser Microphones In Silicon", Apr. 1992, pp. 560–564.

P.R. Scheeper, A.G.H. van der Donk, W. Olthuis, P. Bergveld, "A Review Of Silicon Microphones", Jul. 1994, pp. 1–11.

*Primary Examiner*—Huyen Le

[57] ABSTRACT

Multiple embodiments of a solid state condenser transducer, and methods of manufacture, are disclosed. The transducer comprises a semi-conductor substrate forming a frame and having an opening, a thin-film cantilever structure forming a diaphragm extending over a portion of the opening, the structure having a proximal portion and a distal portion. The proximal portion is attached to the frame, and the distal portion extends over a portion of the frame. A variable gap capacitor having a movable plate and a fixed plate is provided, wherein the movable plate is disposed on the distal portion of the structure and the fixed plate is disposed on the frame adjacent the movable plate.

28 Claims, 13 Drawing Sheets

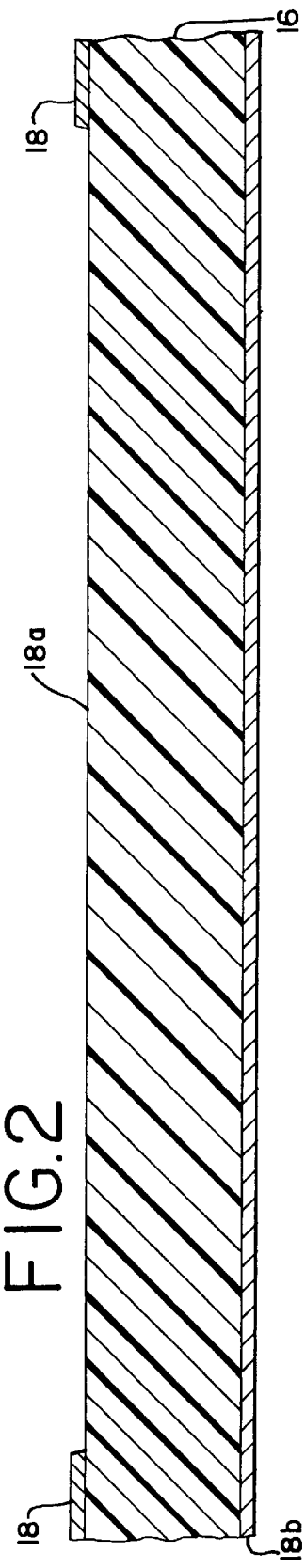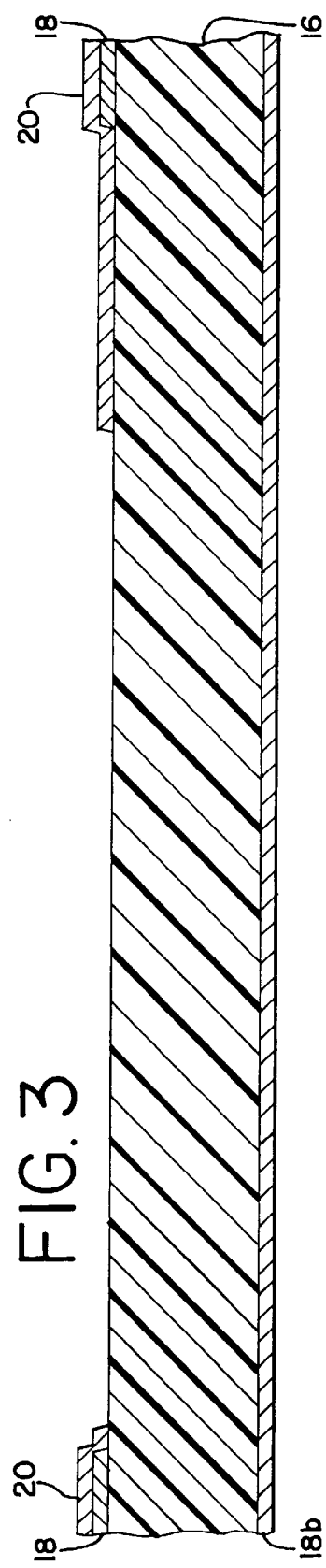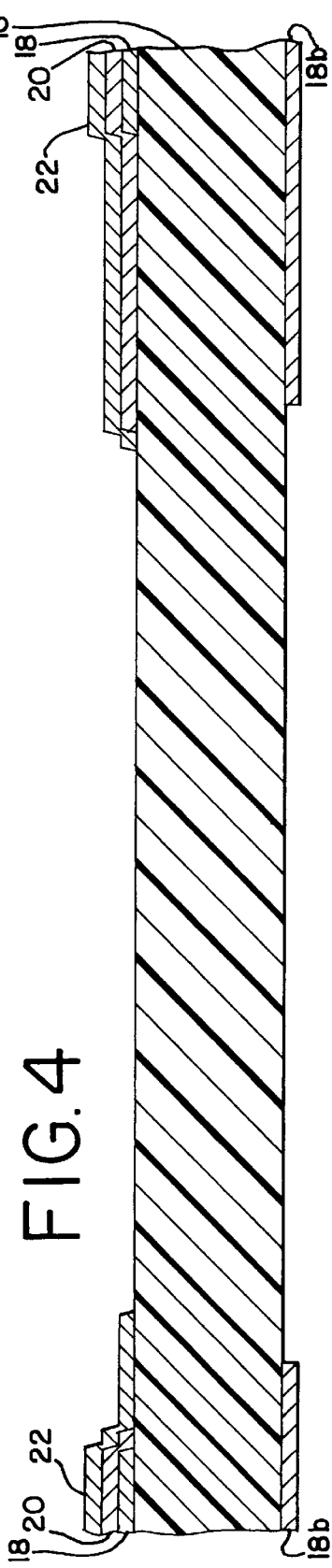

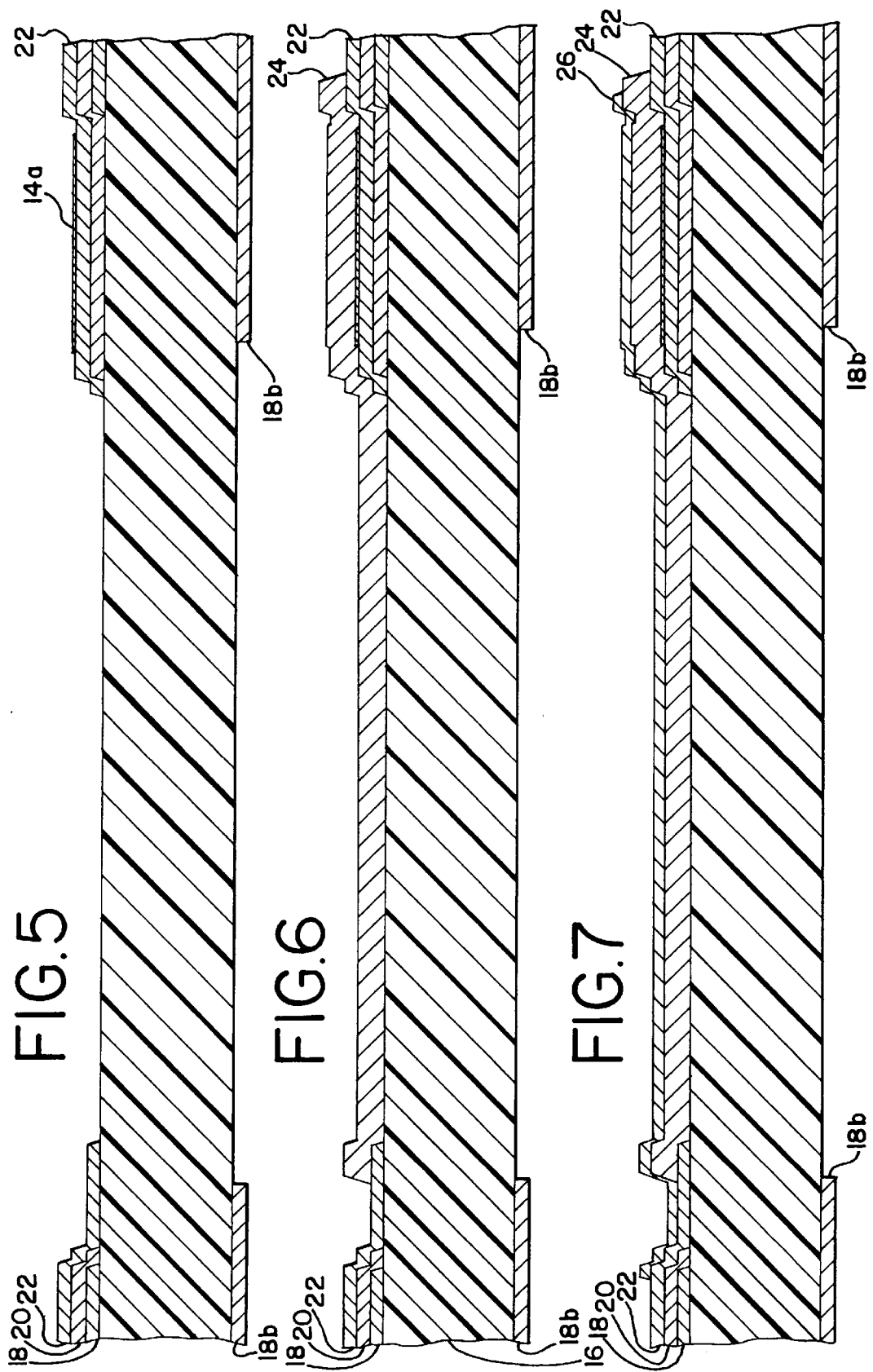

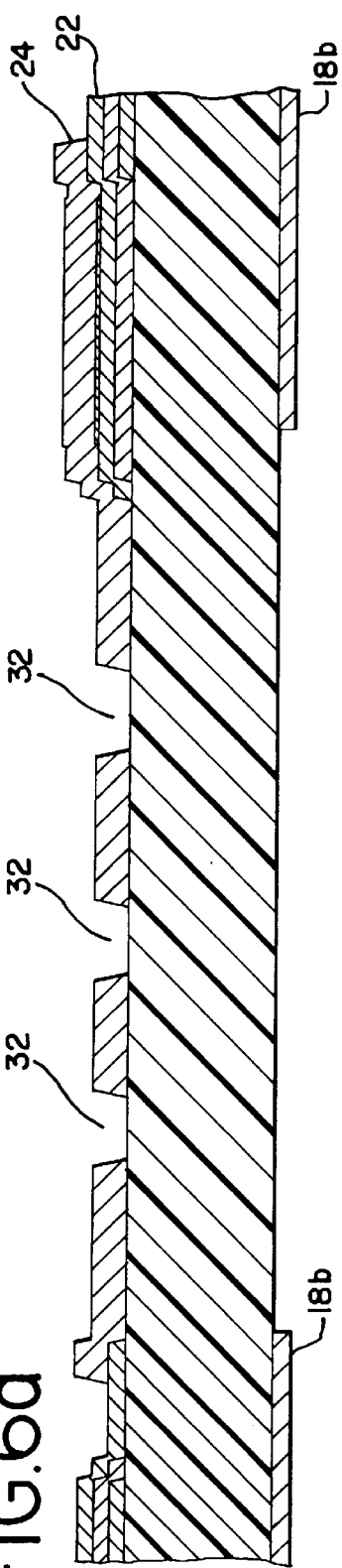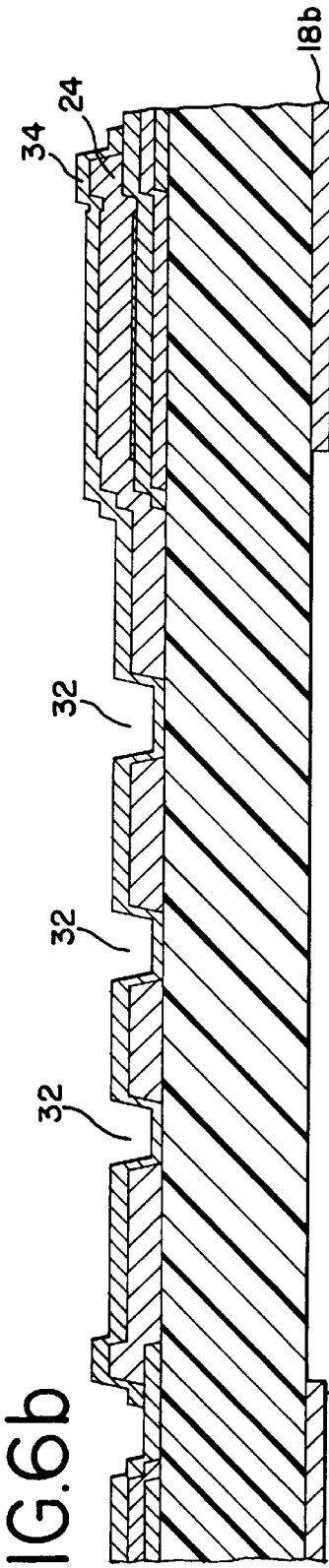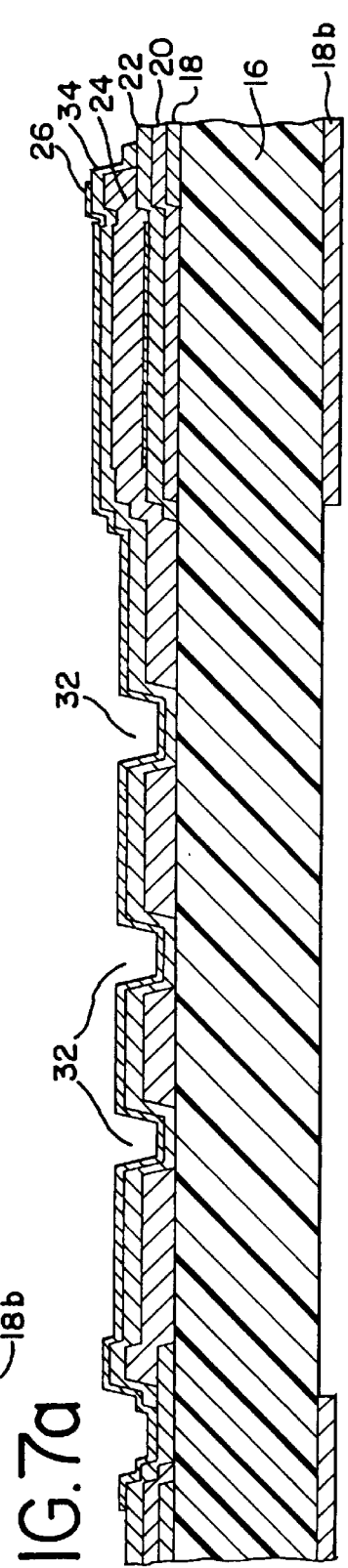

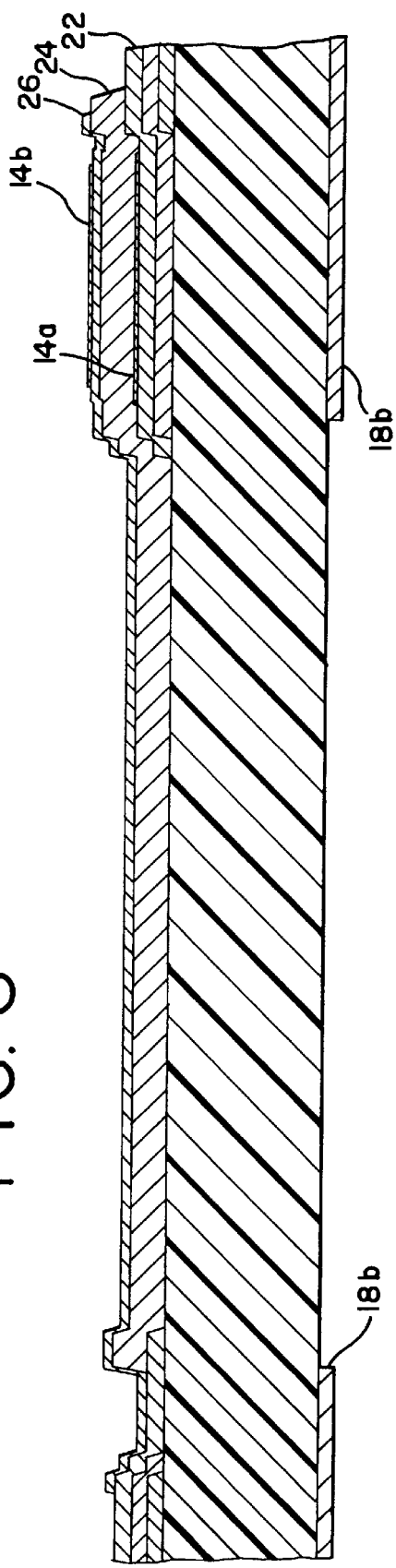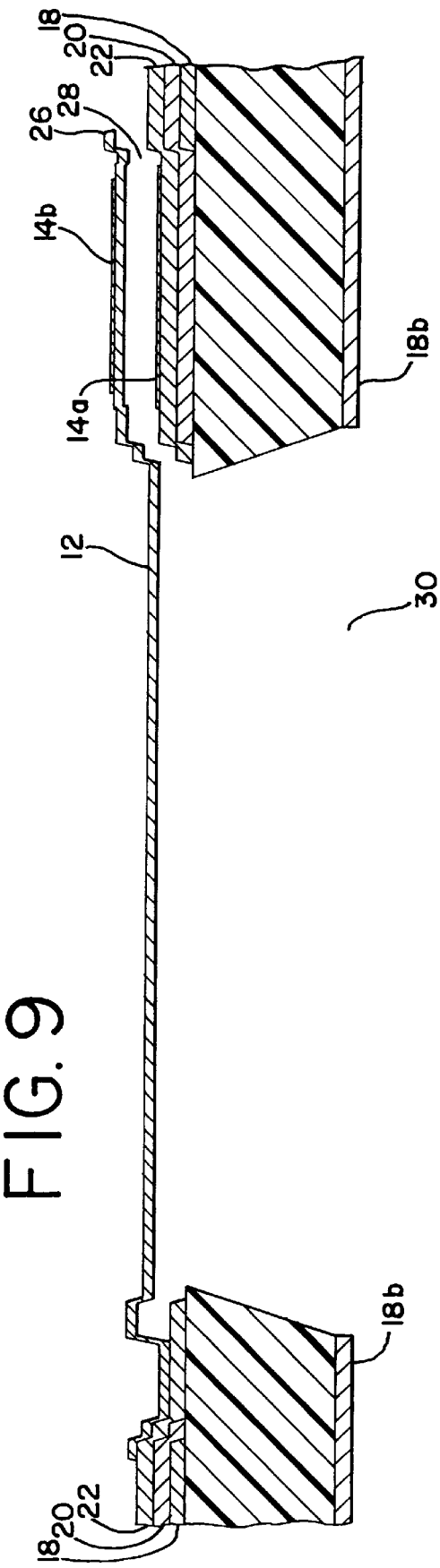
FIG. 8
FIG. 9

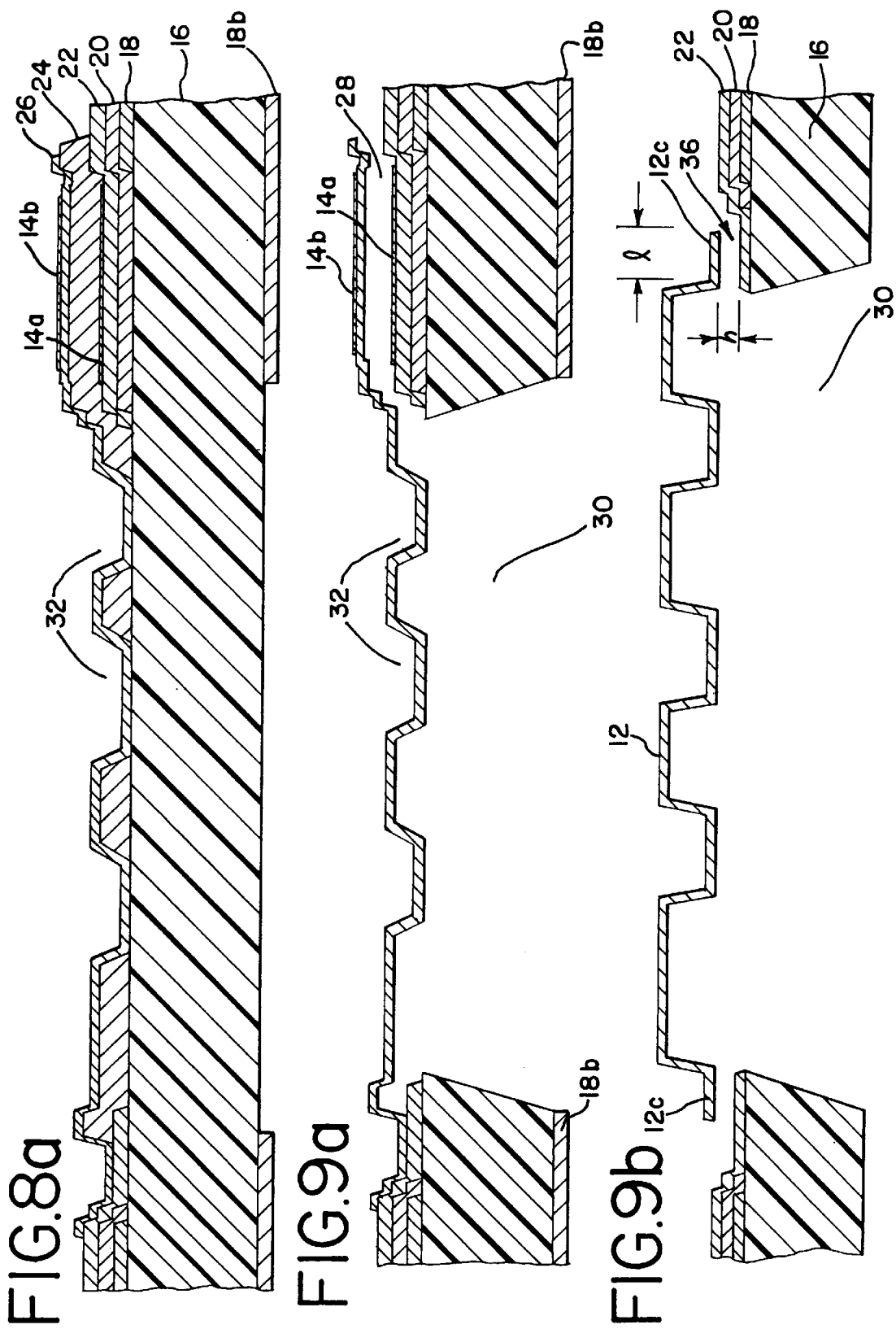

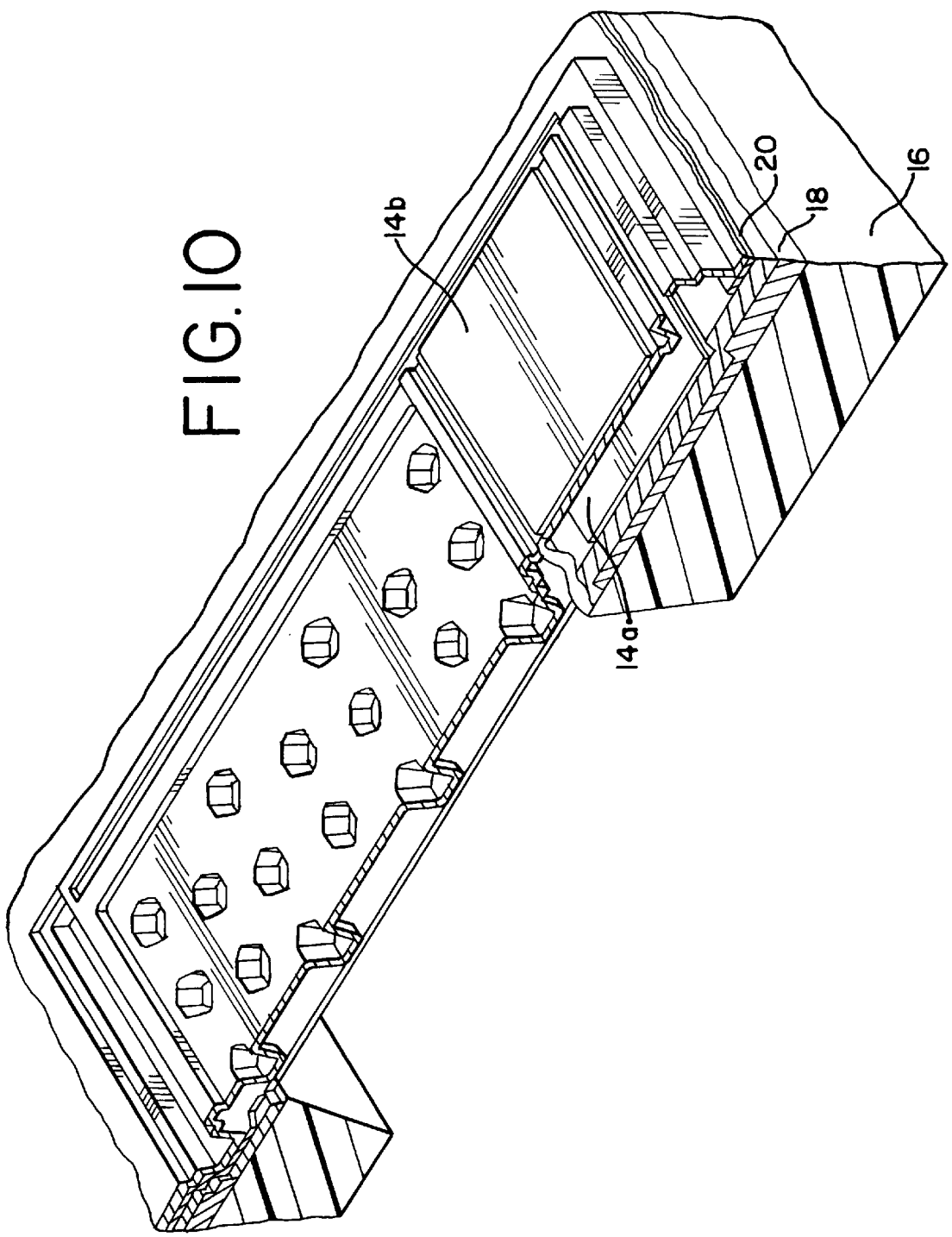

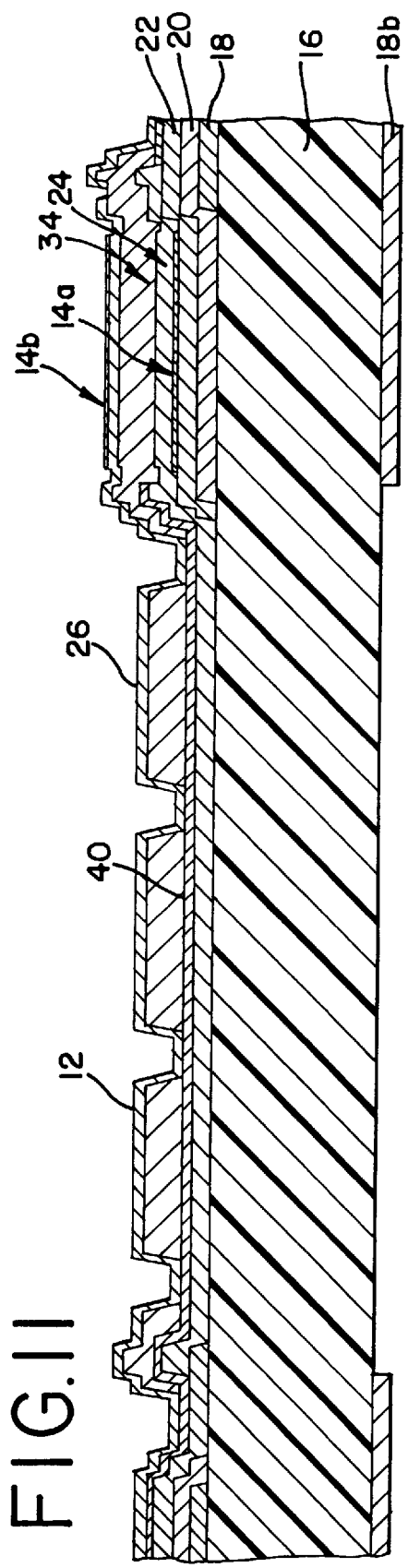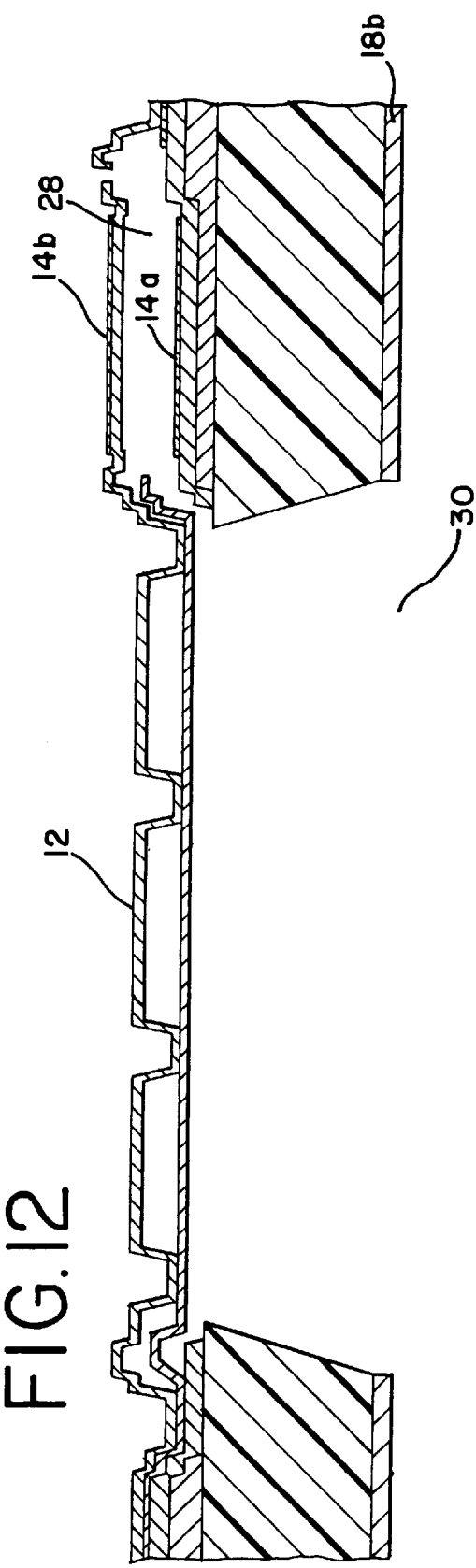

MINIATURE SILICON CONDENSER MICROPHONE

DESCRIPTION

1. Technical Field

The present invention is directed toward a miniature silicon condenser microphone which can be integrated with CMOS circuitry.

2. Background Prior Art

Miniature silicon condenser microphones which can be integrated with CMOS circuitry require a number of trade-offs to achieve high sensitivity and low noise in the smallest volume. Typically a condenser microphone consists of four elements; a fixed, perforated backplate, a highly compliant, moveable diaphragm (which together form the two plates of a variable air-gap capacitor), a voltage bias source, and a buffer amplifier.

The diaphragm must be highly compliant and precisely positioned relative to the backplate, while the backplate must remain stationary and present a minimum of resistance to the flow of air through it. Achieving all of these characteristics in microphones below 1 mm in size using integrated circuit materials has been challenging in three respects. First, silicon-based miniature condenser microphones to date have used a diaphragm held by a surrounding frame, with maximum deflection occurring at the diaphragm center. In this configuration, unrelieved stress in the diaphragm material detracts from either diaphragm compliance (if the stress is tensile which stiffens the diaphragm) or positioning accuracy (if the stress is compressive which buckles the diaphragm). Typical stress levels in integrated circuit thin films, if not relieved in the finished diaphragm, are many times greater than the levels at which the diaphragm becomes unusable due to over-stiffening or buckling.

A second problematic aspect of sub-mm-sized diaphragms is that the compliance tends to decrease very rapidly with decreasing size for a given diaphragm material and thickness. If the units of diaphragm compliance are taken as linear deflection per unit pressure, the compliance scales as the fourth power of the diaphragm size. In a specific example, cutting the diaphragm diameter in half is expected to cut the diaphragm compliance to one-sixteenth of its former value if the diaphragm material, thickness and configuration are kept the same.

The third challenge in miniaturization of microphones below 1 mm in size is that of maintaining a low mechanical damping of the diaphragm displacement. As the structure is made smaller, the air gap must be made smaller (scaling as the inverse of the square of the device size) to keep the capacitor value in a range which can drive the input of the buffer amplifier effectively. Unfortunately as the air gap is reduced, the damping effects due to viscous flow of the air trapped between diaphragm and backplate increase rapidly, varying as the inverse of the third power of the air gap size. The net result is that mechanical damping tends to increase extremely rapidly as the inverse of the sixth power of the device size. This damping affects the frequency response and in accordance with well established theory, generates pressure fluctuations in the microphone structure which contributes noise to the microphone output.

Various approaches have been developed to avoid the problem of excessive stress in miniature condenser microphone diaphragms. The approaches can be categorized by whether they focus on diaphragm material or diaphragm construction. On the material side, Bergquist and Rudolf, Transducers 91, Proceedings of the International Conference on Solid-State Sensors and Actuators (IEEE, New York, 1991) pp. 266–269 discloses single crystal silicon as the diaphragm material to minimize differential stresses from developing with respect to the diaphragm support, which is also made of single crystal silicon.

Bernstein, U.S. Pat. No. 5,146,435, discloses an all-silicon structure consisting of a single crystal silicon diaphragm supported at its periphery by patterned silicon springs.

On the diaphragm construction side, Loeppert, U.S. Pat. No. 5,490,220 discloses a free-plate diaphragm configuration wherein the diaphragm is disconnected from its frame and captured only by a set of lateral restraints. According to Loeppert, material stress is released completely in the finished diaphragm regardless of material mismatches between the diaphragm and its frame.

PCT International Publication WO 95/34917 discloses a piezoelectric cantilever pressure transducer. Alternatively, the transducer may be magnetostrictive, piezoresistive or thermal.

However, none of the above-described approaches solves the inherent film stress issues while maintaining good performance in a manufacturing process.

The present invention is provided to solve this and other problems.

SUMMARY OF THE INVENTION

It is an object of the present invention to provide an alternative diaphragm and backplate construction in which the form of the diaphragm is based on a cantilever and in which alternate configurations for venting the backplate, appropriate for sub-mm-size microphones are used. Such microphones are useful for ultrasonic, as well as audio, transduction of sound.

In the cantilever format, diaphragm material stress is relieved in the final diaphragm structure to almost the same degree as in the free-plate construction, but without the need for the capturing restraints associated with the free-plate. In addition, the compliance of a cantilever structure is over one hundred times greater than that of an edge-clamped diaphragm of the same material, span and thickness, which eases the design of smaller scale devices in spite of the aforementioned difficulties with compliance in diaphragms below 1 mm in size.

This diaphragm, as well as the backplate and integrated CMOS circuitry for backplate voltage bias and buffer amplifier can be fabricated on a single silicon wafer. Several embodiments are given below. The method for venting of the capacitor air gap to minimize mechanical damping depends on the context of the particular embodiment and is thus given in context in each case. The net result is an approach which offers advantages in microphone size and sensitivity which are readily apparent to those skilled in the art.

Other features and advantages of the invention will be apparent from the following specification taken in conjunction with the following drawings.

BRIEF DESCRIPTION OF DRAWINGS

FIGS. 2–9 are sectional views illustrating sequential steps in the manufacture of the microphone of FIG. 1;

FIGS. 6a, 6b, 7a, 8a, 9a and 9b are sectional views illustrating sequential steps in the manufacture of the microphone of FIG. 1a;

FIG. 10 is a perspective view of a third embodiment of a silicon condenser microphone made in accordance with the present invention;

FIGS. 11–12 are sectional views illustrating sequential steps in the manufacture of the microphone of FIG. 10;

FIGS. 13b and 13c are sectional views of the microphone of FIG. 13a;

FIGS. 16b and 16c are sectional views of the microphone of FIG. 16a;

FIG. 17b is a sectional view of the overpressure stop structure of FIG. 17a.

DETAILED DESCRIPTION

Figure 1:
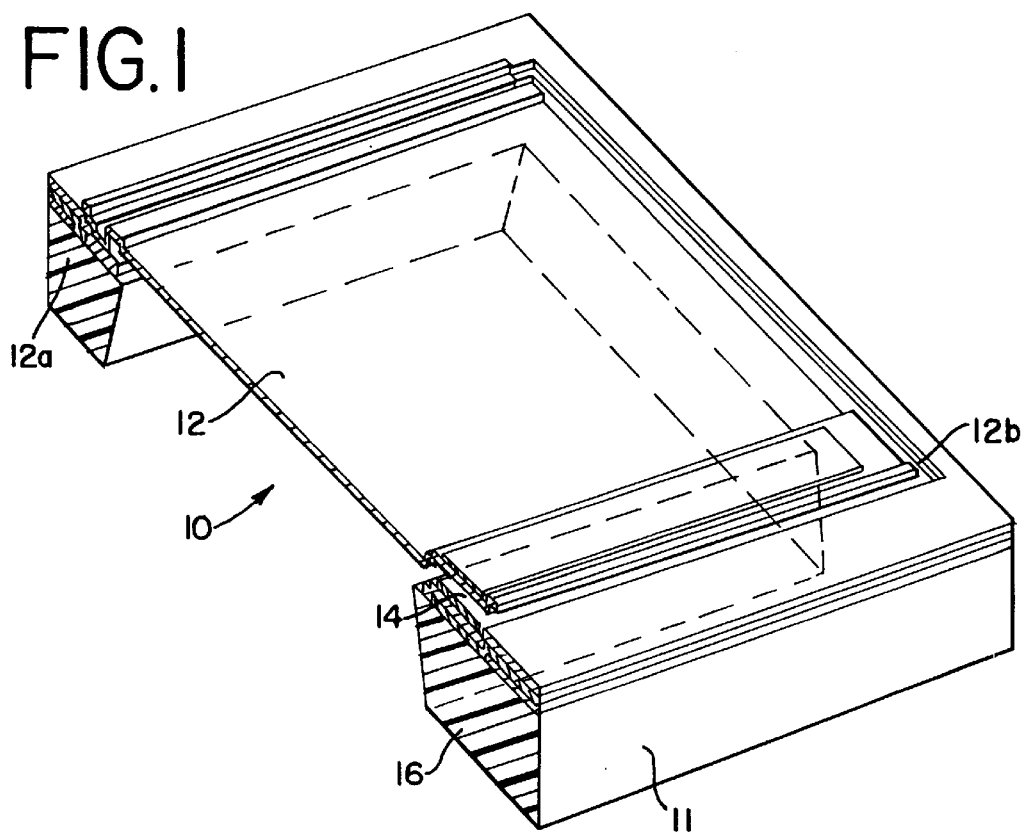
FIG. 1 is a perspective view of a first embodiment of a silicon condenser microphone made in accordance with the present invention.

While this invention is susceptible of embodiments in many different forms, there is shown in the drawings and will herein be described in detail, preferred embodiments of the invention with the understanding that the present disclosure is to be considered as an exemplification of the principles of the invention and is not intended to limit the broad aspects of the invention to the embodiments illustrated.

A cantilever design for a silicon condenser microphone 10 is shown in FIG. 1. The microphone 10 includes a diaphragm 12 anchored to a support structure or frame 11 at a proximal or fixed edge 12a and which is free on the other three edges, including a distal edge 12b. In this way the stiffness of the diaphragm 12 is determined by the thickness and material properties of the diaphragm 12 and not by stresses induced in the diaphragm 12 by processing. A capacitor 14 is disposed adjacent the distal edge 12b of the diaphragm away from the fixed edge 12a, where maximum deflection of the diaphragm 12 due to sound pressure occurs.

Referring to FIG. 2, in accordance with the invention, the microphone 10 is manufactured on a substrate 16, preferably a double side polished silicon wafer, during CMOS processing of other components (not shown) on the substrate 16. During CMOS processing, an active area 18a surrounded by field oxide 18 is formed by a standard LOCOS process where the diaphragm 12 will ultimately be located. As is well known, the LOCOS process also results in a nitride layer 18b on the back side of the substrate 16. The nitride layer 18b is left on the back side of the substrate 16 upon completion of the LOCOS process.

Referring to FIG. 3, a low temperature oxide layer 20 is deposited over the entire surface of the wafer 16. In the CMOS process, the oxide layer 20 is usually left on virtually the entire wafer surface as a dielectric between poly silicon gates and aluminum interconnect (not shown). The aluminum interconnect is used to connect circuits formed elsewhere on the wafer 16. A portion of the oxide layer 20 is then removed to expose the bare silicon substrate 16.

Similarly, in the CMOS process, a silicon nitride passivation layer 22 is usually left on virtually the entire surface of the wafer 16 to protect the low temperature oxide 20 and the layer of aluminum interconnect. As shown in FIG. 4, the silicon nitride passivation layer 22 is patterned in such a way as to provide the usual protection in CMOS circuit areas elsewhere on the wafer 16, but once again is locally removed to expose the bare silicon substrate 16 in the area where the diaphragm 12 will be. The silicon nitride passivation layer 22 thus forms a barrier to protect the CMOS area from an anisotropic etchant, preferably potassium hydroxide (KOH), in the final micro-machining step, discussed below. The back layer of nitride 18b is also patterned to form an etch mask for the final micromachining step, discussed below.

The capacitor 14 includes a fixed plate 14a, or backplate, and a movable plate 14b. Referring to FIG. 5, a metal layer, preferably chrome in the range of 0.1–0.2 microns thick, is deposited and patterned to form the fixed plate 14a.

Referring to FIG. 6, a sacrificial layer 24, preferably aluminum, approximately 4 microns thick, is deposited and patterned. This sacrificial layer 24 will eventually be removed to form the gap between the fixed plate 14a and movable plate 14b of the capacitor 14.

Referring to FIG. 7, a silicon nitride diaphragm layer 26, typically 1 micron thick, is deposited and patterned.

Referring to FIG. 8, a metal layer, preferably chrome approximately 0.02 micron thick, is deposited and patterned on the silicon nitride diaphragm layer 26 to form the movable plate 14b. A thickness of 0.02 microns was utilized as a balance between stress and conductance considerations. A thinner layer would result in less conductance, but would also result in less stress.

Although not specifically shown, a layer of titanium tungsten alloy followed by a layer of gold can be deposited and patterned to protect aluminum bond pads elsewhere on the wafer 16.

The final micromachining step is illustrated in FIG. 9. In this step, the entire wafer is etched with an anisotropic etchant, preferably potassium hydroxide (KOH). This step forms both a capacitor gap 28 between the movable and fixed elements of the microphone 10 as well as forms a hole 30 below the diaphragm 12.

The performance of the cantilevered microphone 10 illustrated in FIG. 1 tends to deviate from the optimum in two respects. First, because of the aforementioned compliance properties of cantilevers versus edge-clamped diaphragms, this cantilever structure as shown in FIG. 1 is actually so compliant that it overloads at the highest sound pressures encountered in certain microphone applications. Second, the cantilevered diaphragm of FIG. 1 fabricated from integrated circuit thin film materials as described above tend to curl due to three sources of unrelieved stress: (1) stress gradients through the thickness of the thin film remaining from deposition; (2) differential stresses caused by the addition of thin chrome or other metallization to the surface of the diaphragm; and (3) unrelieved film stresses at the fixed edge 12a, where the diaphragm 12 is anchored.

Two types of constructions described below have been developed to match the diaphragm compliance to the desired pressure range as well as to counteract any curling tendency of the diaphragm 12.

A structure has a "bending moment", which relates its shape to its stiffness. A thicker film would increase the bending moment, but would also increase the diaphragm mass undesirably and would also simply increase the forces and moments which drive the curling tendency. Both types of constructions, described below, work by increasing the bending moment of the diaphragm without changing the thickness of the film.

Figure 1A:
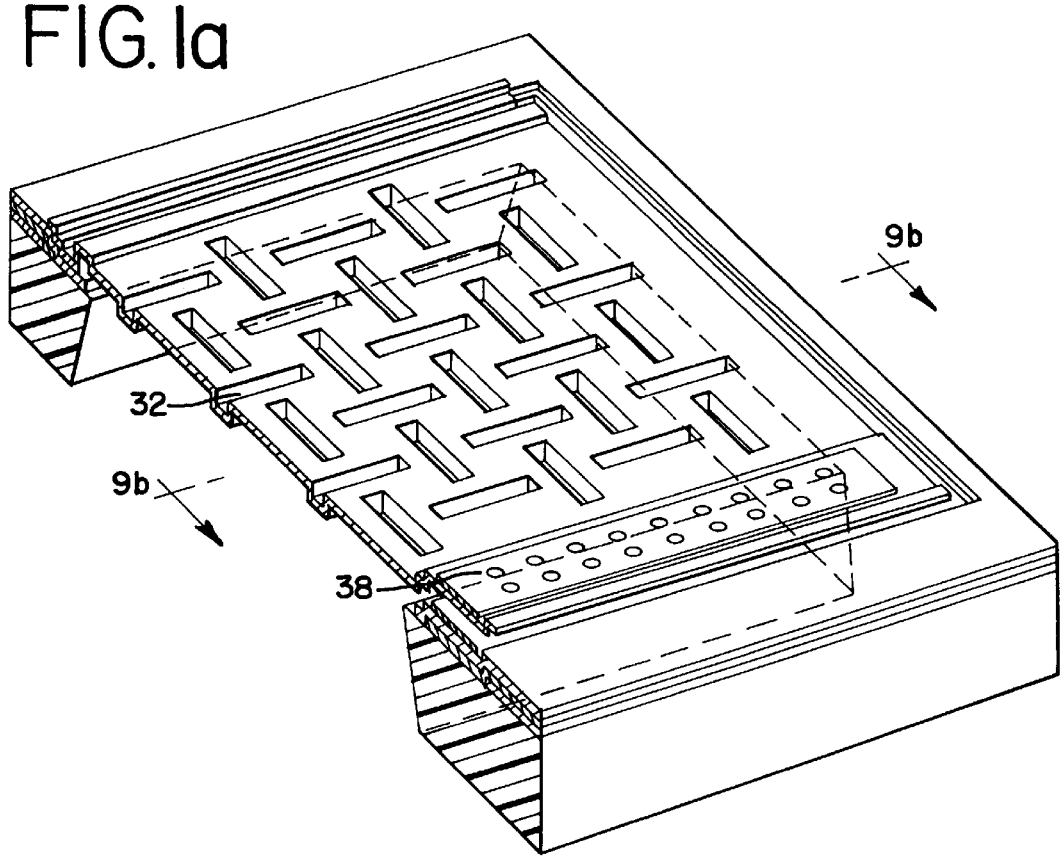
FIG. 1a is a perspective view of a second embodiment of a silicon condenser microphone made in accordance with the present invention.

The first construction for increasing the bending moment is to corrugate a diaphragm built from a single film layer. An initial approach might consist of running corrugations from the root of the cantilever to the tip. The film, however, has an equal tendency to curl across the cantilever as along it, so that a structure having only straight longitudinal corrugations could still curl in the transverse direction. Thus a more sophisticated corrugation pattern must be used which raises the bending moment about all possible cross sections of the diaphragm. One such corrugation pattern is shown in FIG. 1a. Many other patterns are possible. As disclosed in FIG. 1a, no matter what section is taken, it will cross several corrugations.

The manufacture of the diaphragm of FIG. 1a is similar to that of the diaphragm of FIG. 1, but for the steps illustrated in FIGS. 6a, 6b, 7a, 8a, 9a and 9b.

Referring to FIG. 6a, the sacrificial layer 24 has been additionally patterned to form corrugations 32.

As illustrated in FIG. 6b, a second sacrificial layer 34, in the range of 1–2 microns, is deposited and patterned upon the first sacrificial layer 24. This second sacrificial layer 34 permits one to separately control the dimension of the capacitor gap 28 and the height of the corrugations 32.

Referring to FIG. 7a, the silicon nitride diaphragm layer 26, typically 1 micron thick, is deposited and patterned. This step is similar to that illustrated in FIG. 7, but for the presence of the corrugations 32.

Referring to FIG. 8a, the metal layer, preferably chrome approximately 0.01 micron thick, is deposited and patterned on the silicon nitride diaphragm layer 26 to form the movable plate 14b. This step is similar to that illustrated in FIG. 8, but for the presence of the corrugations 32.

Although not specifically shown, as with the first embodiment, a layer of titanium tungsten alloy followed by a layer of gold can be deposited and patterned to protect aluminum bond pads elsewhere on the wafer 16.

The final micromachining step is illustrated in FIG. 9a. In this step, the entire wafer 16 is etched with an anisotropic etchant, preferably potassium hydroxide (KOH). This step forms both the capacitor gap 28 between the movable and fixed elements of the microphone 10 as well as forms the hole 30 below the diaphragm 12. This step is similar to that illustrated in FIG. 9, but for the presence of the corrugations 32.

If deeper corrugations are required, the silicon is trench etched before deposition and patterning of the sacrificial layers in order to increase the total corrugation amplitude.

The low frequency rolloff point of a microphone is determined by the inverse of the product of the back volume compliance, in acoustic farads, and the acoustic resistance of the pressure equalization path, in acoustic ohms. The equalization path in this device is around the edges of the cantilever diaphragm and continuing through the hole in the silicon substrate. For the very small microphones which are sought here, with back volumes on the order of 2 to 3 cubic mm, the acoustic resistance of this path must be quite high, on the order of 1 million acoustic ohms, to maintain flat response down below 100 Hz.

FIG. 9b is a section of FIG. 1a, taken along the line 9b—9b thereof. As illustrated in FIG. 9b, the high acoustic resistance is obtained by forming an overlap 12c of the diaphragm 12 extending past the edge of the hole 30. This overlap 12c defines an equalization path 36 which has a length "l" on the order of 5 to 10 microns, and has a gap height "h" between the diaphragm 12 and the wafer 16 of 1 to 2 microns.

The various vertical dimensions needed for the capacitor gap 28, the corrugations 32 and the pressure equalization path 36 can all be realized using the two independently patterned sacrificial layers. As an example, and referring to FIG. 6b, a first sacrificial layer 24 of 3 micron thickness can be patterned to create the height differences needed for diaphragm corrugations while the second sacrificial layer 34 of 1 micron thickness is used to set up the height "h" of the equalization path 36. The second (1 micron) sacrificial layer 34 is also left covering the entire corrugation relief pattern so that the height of the corrugations 32 is unchanged, but together the sacrificial layers 24, 34, create a 4 micron capacitor gap 28. If complete independent control of these three dimensions (corrugation height, capacitor gap, equalization path height) is desired, then a third sacrificial layer (not shown) is required.

For all condenser microphones, there is a combination of sound level and bias voltage which will result in a irreversible collapse of the diaphragm onto its backplate. The position of a diaphragm in a zero bias voltage/zero sound pressure condition will be referred to as the unloaded position of the diaphragm. While in typical applications, the bias voltage can be controlled, it is often difficult to control the maximum sound pressure. If movement of the diaphragm from its unloaded position is limited, and the proper bias voltage is maintained, then this irreversible collapse can be prevented.

In microphones of the present invention, the small height "h" of the pressure equalization path 36 (see FIG. 9b) also serves, under high sound pressures, to limit diaphragm deflection to about 1 micron, so that the electrostatic forces at the capacitor 14 can not take over and cause irreversible collapse of the diaphragm 12.

The great majority of the area under the diaphragm 12 in the previously described structures is directly over the hole 30 in the substrate 16. This means that air displaced by movement of the diaphragm 12 can move freely without appreciable resistance. However, in the area of the capacitor 14, the air is trapped in the 3 to 4 micron capacitor gap 28 between diaphragm and backplate and forced to flow laterally until the air reaches an opening. Due to the viscosity of air and the small dimension of this flow path through the capacitor gap, considerable damping of the diaphragm response can occur. This damping can both affect the high frequency response and add noise to the microphone output. The common method to overcome this is to perforate the backplate, but since in this case the backplate is formed on solid silicon, the damping problem is solved by introducing perforations, or holes, 38 extending through the diaphragm 12, including the movable plate 14b, as shown in FIG. 1a. The use of holes has provided satisfactory response out to 50 kHz.

A second structure for increasing the bending moment is to build the diaphragm 12 using a sandwich of two quilted films separated by a thin 2–3 micron sacrificial spacer. The two films are periodically attached together, as shown in FIG. 10, to form a quilted structure. The bending moment is now increased to virtually the same degree across all sections, except for a slight deviation for those cross sections which cut through the rows of attachment points. This deviation can be minimized by keeping the ratio of attachment size to attachment spacing small.

The method of manufacture of this diaphragm is similar to that disclosed above with respect to the embodiment of FIG. 1a, but is more particularly illustrated in FIGS. 11 and 12.

According to this method, after deposition and patterning of the first sacrificial layer 24, having a thickness of 1 micron, a first silicon nitride diaphragm layer 40, having a thickness of 0.5 micron is deposited and patterned. Thereupon a second sacrificial layer 34 (corresponding to the layer 34 of the embodiment of FIG. 1a, and having a thickness of 3 microns) is deposited and patterned. Subsequently, a second silicon nitride layer 26, having a thickness of 0.5 micron, is deposited and patterned. The layer 26 alone will serve to support the moving plate 14b of the capacitor 14.

Figure 13:
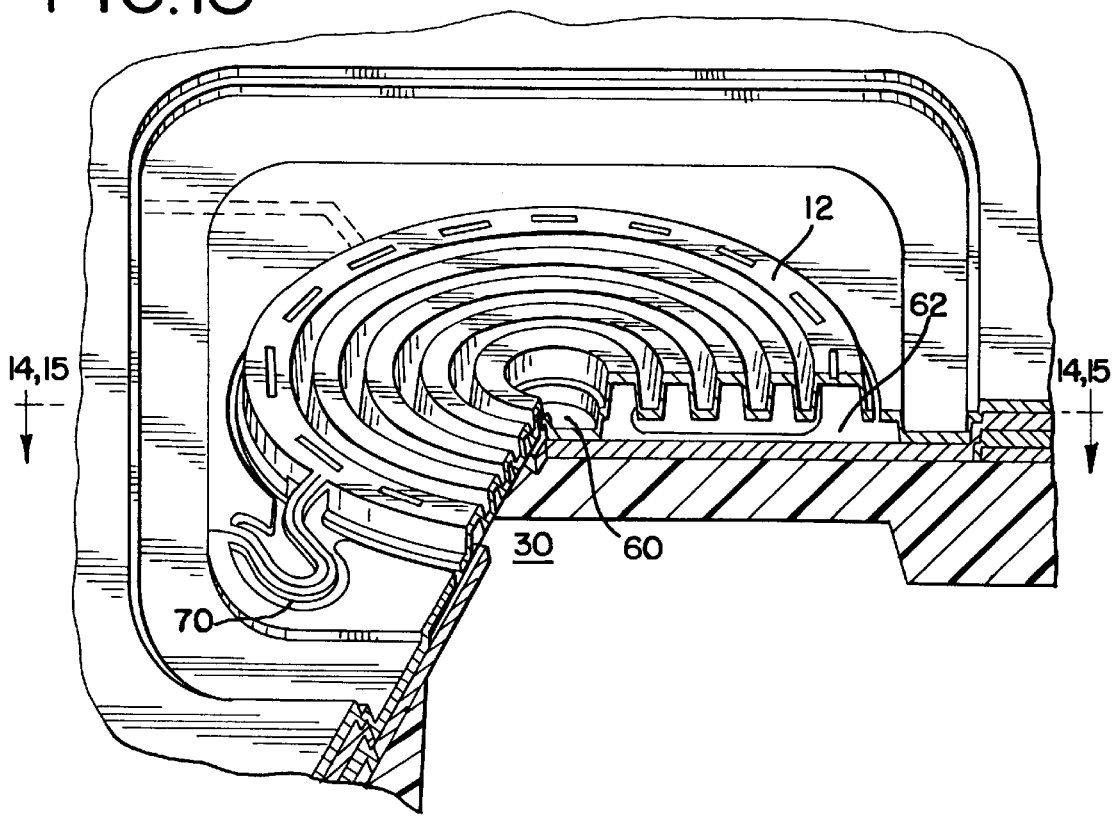
FIG. 13 is a perspective view of a fourth embodiment of a silicon condenser microphone made in accordance with the present invention.

An alternate and preferred diaphragm structure is illustrated in FIG. 13. This structure comprises a circular diaphragm which is anchored in the center. The advantage of this form is that it eliminates the two free side edges of the linear cantilever where lateral curling is most difficult to suppress. The only free edge left is the circular periphery. For a given diaphragm size and diaphragm material and thickness, the compliance of this structure, if the structure is kept flat to within a dimension equal to the corrugation amplitude, is intermediate between that of the edge-supported diaphragm and the linear cantilever, being five times the former and approximately one-twentieth of the latter. The curling tendencies of this structure are also intermediate. The compliance of this structure can also be adjusted to the desired value by incorporating corrugations of the appropriate amplitude. These corrugations can be radial, circular (preferred) or tangential to an inner radius like a pinwheel. Circular corrugations are preferred because they can be put in without being interrupted by the anchor area.

Figure 14:
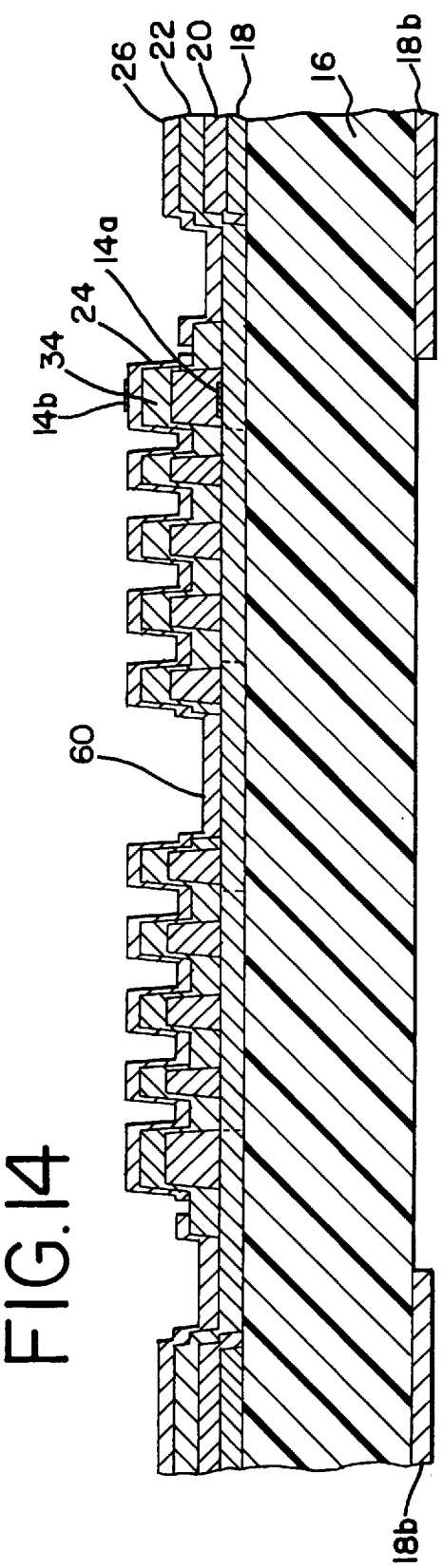
FIGS. 14–15 are sectional views illustrating sequential steps in the manufacture of the microphone of FIG. 13.
Figure 15:
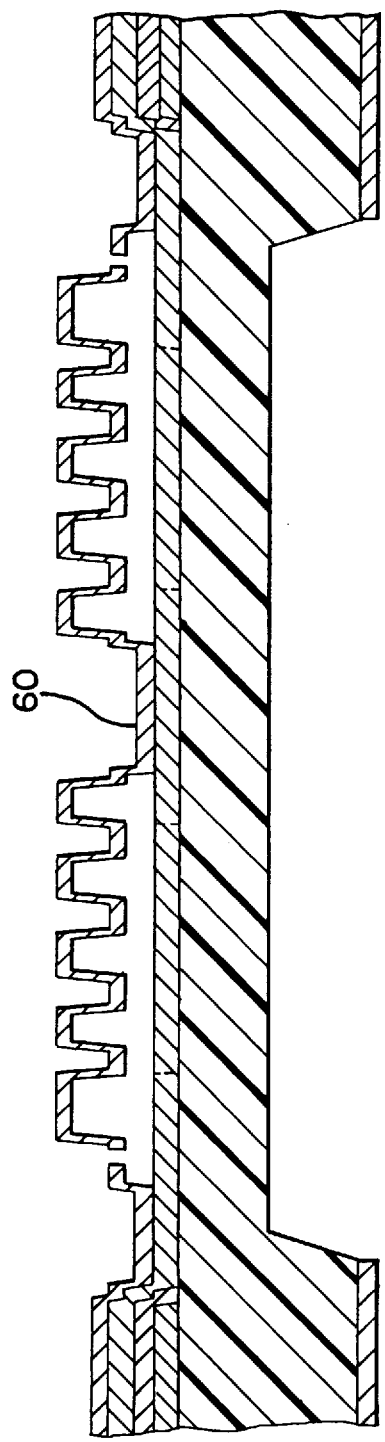

The process of constructing the embodiment of FIG. 13 is similar to that of forming the embodiment of FIG. 1a, but for the step of forming the anchor 60. FIGS. 14 and 15 illustrate cross-sections of this embodiment.

The anchor 60 for the center-supported circular diaphragm 12 falls at the center of the substrate hole 30. Thus some means of diaphragm support other than the surrounding substrate surface must be provided to connect the anchor to the surrounding substrate.

The preferred method is to pattern a deposited combination of a LOCOS nitride film 18c on the front side of the wafer 16 (which in the linear cantilever design had been removed) and the passivation nitride 22 in such a way as to form a tensioned, perforated thin film structure, or web, 62 across the substrate hole 30, and to attach the diaphragm 12 to the web 62 at the anchor 60. As described above in connection with the cantilever design of FIG. 1, an active area is formed during CMOS processing where the diaphragm and substrate hole will be. However, in this case the LPCVD silicon nitride layer 18c, which is typically used to define the active areas in a LOCOS process by blocking the growth of field oxide, is left in place over the area where the diaphragm 12 and the substrate hole 30 will be. In a conventional LOCOS process, this nitride layer is stripped away entirely after it masks the field oxidation step. The silicon nitride typically is highly tensile, which is of use in tensioning the final structure. Within the active area, the CMOS low temperature oxide 20 is removed as before to expose silicon nitride 18c. Silicon nitride passivation 22 is deposited on the wafer 16 and patterned by etching. In the etch step however, the etch time is extended so that the underlying LOCOS nitride 18c is etched as well, acquiring the same pattern as the silicon nitride passivation 22, thus forming the web 62, as shown in FIG. 13a. When the wafer 16 is etched in KOH at the end of the process, the bulk silicon etch acting on the front of the wafer 16 ultimately forms 4 pockets 66. The pockets 66 begin at the 8 openings 66a in the web 62 and then expand laterally until a limiting rectangular boundary 66b is reached. As expected for an anisotropic etchant, this boundary is the largest rectangle which circumscribes the original etch openings and which is aligned with the (111) crystal planes of the substrate 16. In the present case, the extent of this lateral etch undercuts the web 62 so that a large area of the web 62 becomes free-standing. There are, however, 4 thin silicon ribs 68, one between each of the pockets 66b, which ribs 68 extend between the anchor 60 and the substrate 16. The rigidity of this structure is then derived both from the ribs 68 as well as from the tension in the films 18c, 22 from which the structure is made. The patterning of the films 18c, 22 is done in such a way as to include a sufficient total area of web 62 attached on the surrounding substrate to provide stiff support but also so as to include a sufficient number of openings to minimize the resistance of displaced air flow into the hole 30. If the silicon nitride passivation layer 22 is available in a tensile state as deposited, the preferred embodiment is to leave out the LOCOS nitride 18c and use the silicon nitride passivation layer 22 alone, thus making the process flow more like that of a conventional CMOS process. The hole 30 is formed by the simultaneous pocket etching from the front of the wafer 16 and the back side etching through the openings in the LOCOS nitride 18b.

In this center supported circular diaphragm design, the compliance in the capacitive region is a result of the sum of the compliances of the diaphragm 12 and the backplate web 62.

In order to achieve greater compliance, the ribs 68 can be eliminated by extending the etch time of the final micromachining. In fact, all of the compliance can be obtained from the backplate web 62, and the diaphragm 12 can be very stiff.

An advantage of the silicon center support for a circular diaphragm is that it is a very flat and stable foundation for the diaphragm. The center silicon support is also more isolated from package generated stresses than the tensioned thin film support structure. Also since the support is made of bulk silicon, its reaction to unrelieved film stresses at the diaphragm attachment are negligible compared to the tensioned thin film support structure.

The preferred method of substrate etching (anisotropic etch) creates a square hole. The periphery of the round diaphragm must either overlap substantial areas of the surrounding substrate surface or leave the corners of the substrate hole uncovered, depending on the relative sizes chosen for diaphragm and substrate hole. In the former case, a substantial area of air is trapped between diaphragm and substrate, requiring diaphragm perforations, in the manner described above, to avoid viscous damping due to flow of displaced air. In the latter case, large leakage areas are created at the corners of the substrate hole, which can be eliminated if the tensioned film used in connection with the aforementioned diaphragm support methods (preferably silicon nitride passivation) is extended to fill in the corners of the hole. A region of narrow-gap overlap between diaphragm and substrate is thus re-established as required to control leakage through the barometric relief path. Free edges of the added tensioned film in the hole corners tend to curl somewhat, which detracts from control of the narrow gap in the barometric relief path; in the preferred design a few additional strips 62a of the tensioned film are included which flatten the free edges of the corner film areas by pulling them toward the center of the device. The capacitor is incorporated into the device near the edge of the diaphragm because the maximum amplitude of pressure-driven motion occurs there. The diaphragm electrode is established by metallizing the capacitor area of the diaphragm. The construction of the backplate depends on the size chosen for the diaphragm. For a large diaphragm which overlaps the solid substrate surfaces surrounding the substrate hole, the backplate electrode is established by metallizing the surface of the passivation-coated substrate.

Figure 13D:
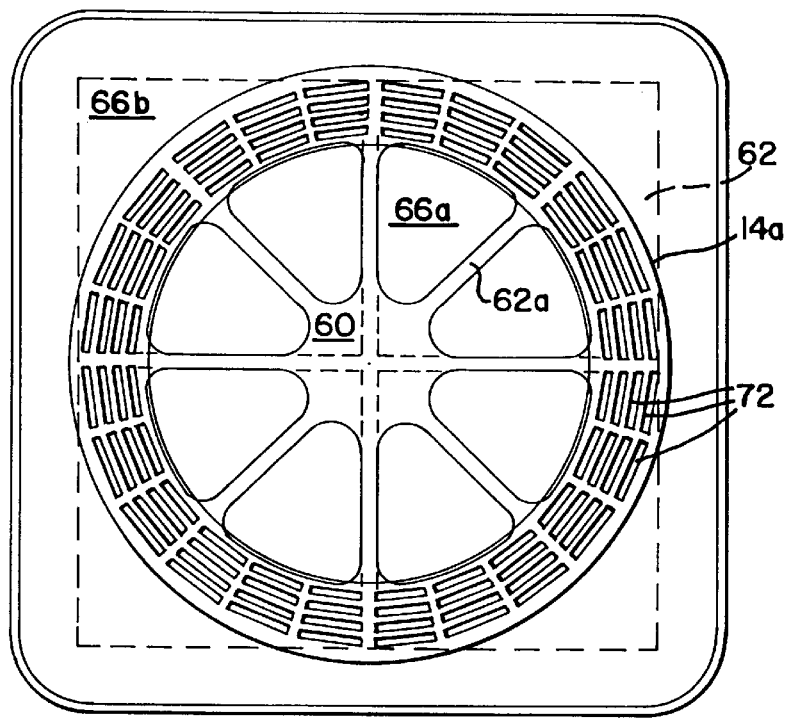
FIG. 13d ia a plan view of the microphone of FIG. 13a, including the diaphragm.
Figure 13A:
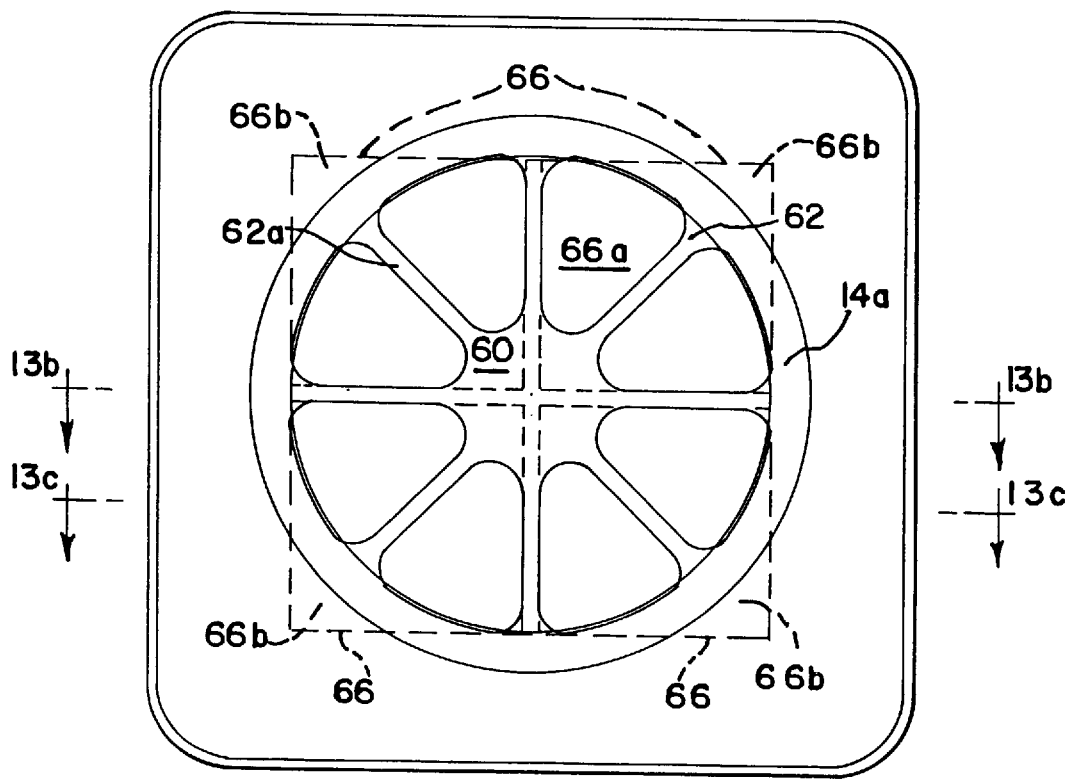
FIG. 13a is a plan view of the microphone without a diaphragm of FIG. 13.
Figure 13B:
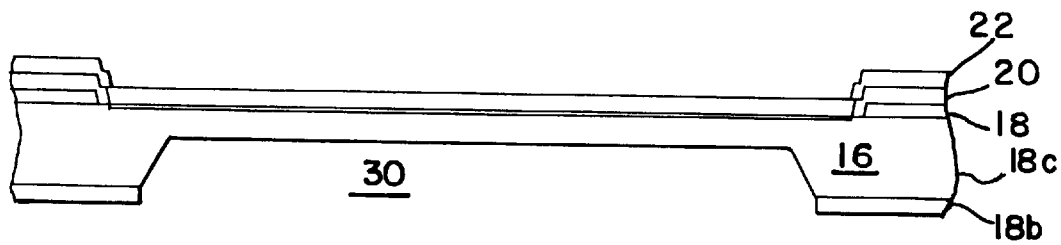
Figure 13C:
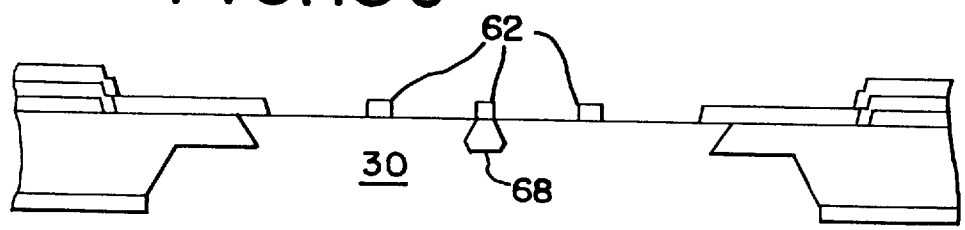

For a smaller diaphragm, as shown in FIG. 13d, for which areas of tensioned film must already fill the corners of the substrate hole as described above, the backplate is established by simply extending these areas of tensioned film further, forming a free-standing backplate film structure which underlies the metallized peripheral area of the diaphragm. These additional tensioned film areas are then also metallized to form the backplate electrode 14a. The stress of the backplate metallization may be chosen to enhance the net tension of the film structure; in any case the net stress of the metallized backplate film must be tensile. Once again the air trapped between diaphragm and backplate must be properly vented to avoid viscous damping. In this case the preferred approach is to perforate the backplate film rather than the diaphragm since the backplate structure has less of a tendency to curl when perforated. The backplate perforations 72 may be shaped as either holes or slots. Typical parameters of hole perforation are a hole diameter of 5 micrometers and a hole spacing of 10 micrometers. Typical parameters of slot perforation are 14 micrometer slot, 24 micrometer spacing. In the case of slot venting the remaining backplate material takes on a web-like character; the intersection angles and widths of the linear elements of such a backplate structure must be chosen such that tensioning forces are balanced in the structure as it was first patterned and tensioning forces do not become redistributed when the backplate structure is released.

The electrical connection to the metallized diaphragm 14a can be routed through the center post or preferably on a thin nitride leader 70 to attach to the edge of the diaphragm. As shown in FIG. 13, this results in a minimum of additional parasitic capacitance.

A problem which arises when a given diaphragm corrugation design and a backplate perforation pattern are combined is that some low areas of the corrugation pattern fall over backplate film material. This generates regions in which the air gap is on the order of one micrometer rather than the 4 micrometer dimension found elsewhere. Since, as stated above, viscous damping effects scale as the inverse of the cube of the air gap, mechanical damping accumulates over fifty times more rapidly per unit area in these locations than in the rest of the structure.

Two methods for avoiding this are included here. The first is to perforate the diaphragm at such locations, discussed above. If these locations are not too numerous the corrugation of the diaphragm is not upset enough to alter the compliance or the curl suppression of the diaphragm significantly.

The second method for avoiding this damping contribution is to avoid corrugation/backplate crossings altogether.

Figure 16A:
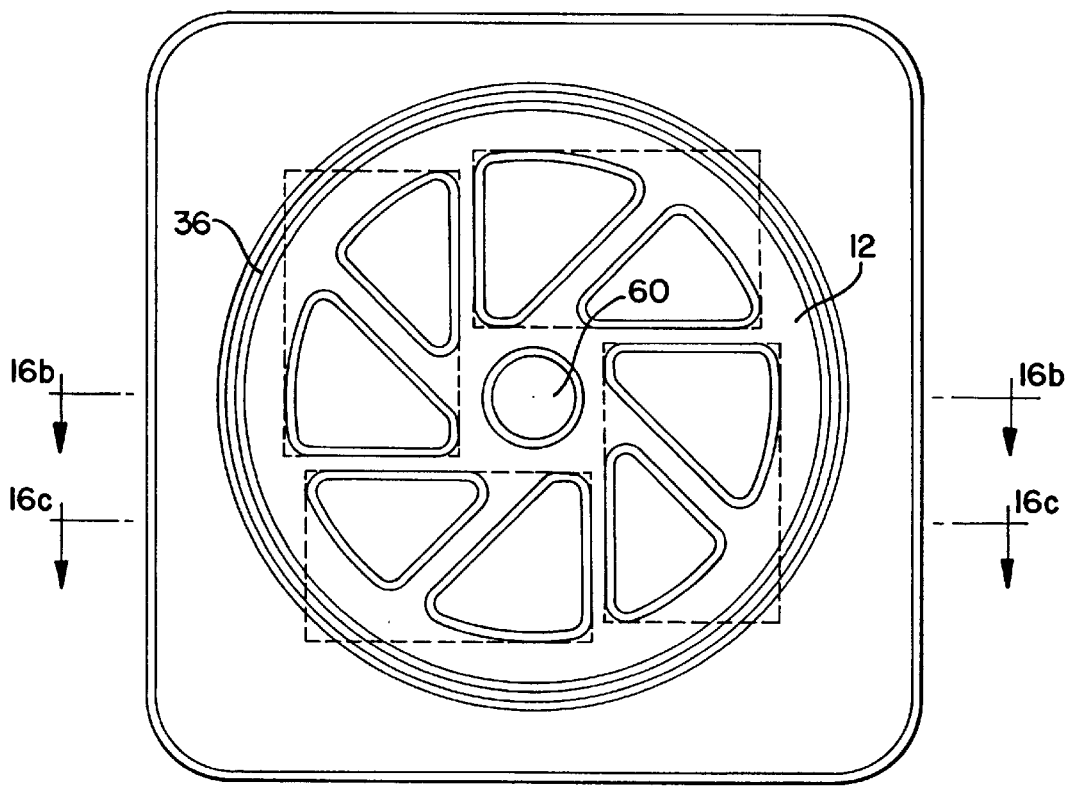
FIG. 16a is a plan view of a modification of the fourth embodiment of the invention.
Figure 16B:
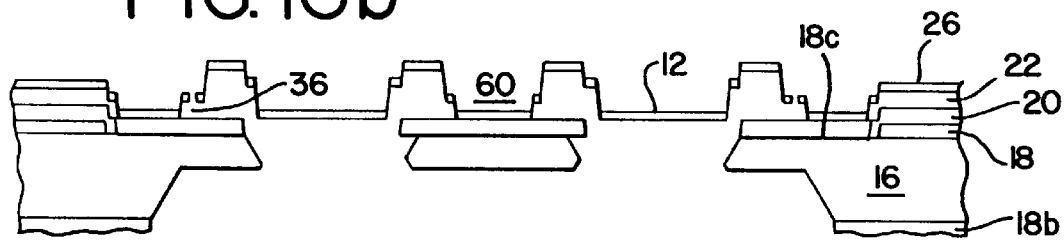
Figure 16C:
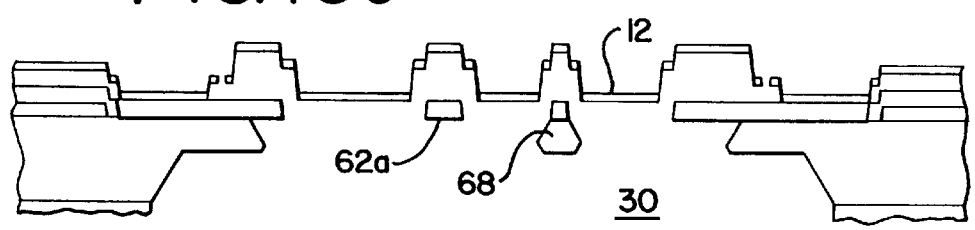
Figure 16:
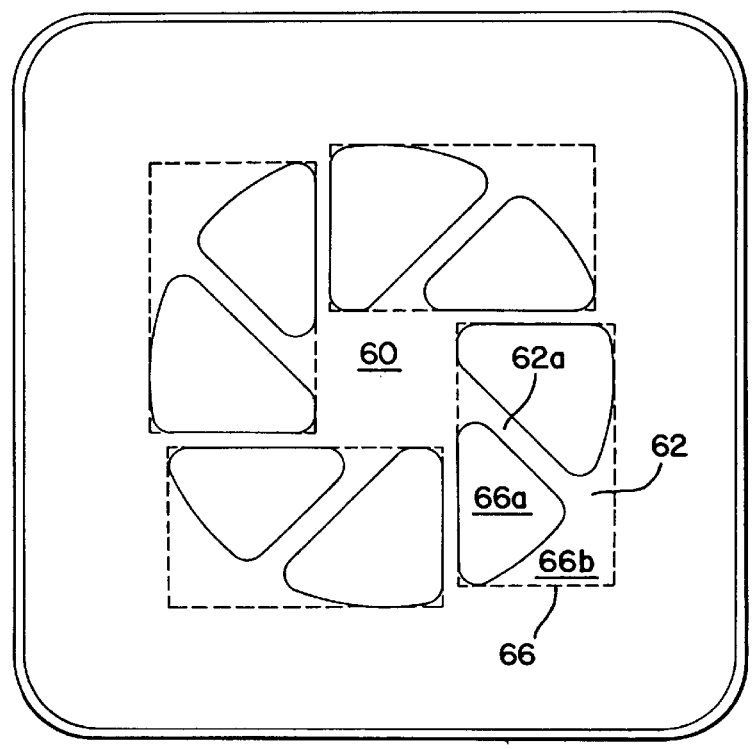
FIG. 16 is a plan view of the web structure of a modification of the fourth embodiment of the invention.

FIGS. 16, 16a. 16b and 16c show such a design. This approach uses a generally radial arrangement of corrugations and a matching radial arrangement of strips 62a of the web 62. All of the web strips 62a fall underneath high areas of the diaphragm corrugation pattern except for the equalization path 36 at the periphery, where the height "h" of the equalization path 36 is reduced, and near the central diaphragm anchor area where there is very little diaphragm deflection. This design also illustrates the third corrugation scheme, mentioned above, which represents a mixture of the radial and the circular methods. As shown in FIG. 16a, the corrugations are placed tangential to an inner radius, which makes them mostly radial in character at the edge of the diaphragm but converging to a circular corrugation near the center. When this placement of diaphragm corrugations is matched with strips of tensioned film a web is formed which constitutes the backplate structure and masks the silicon hole etch to form the silicon ribs and an enlarged central diaphragm support area described above. The silicon ribs under the web provide stiffness to the structure. The converged diaphragm corrugations anchor to this central support area.

Figure 17A:
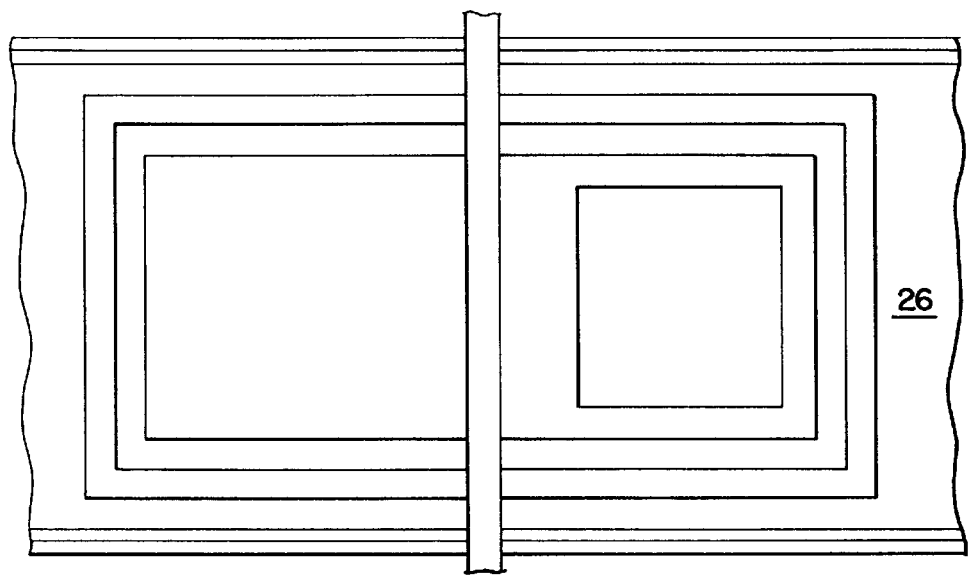
FIG. 17a is a plan view of an overpressure stop structure for use with the microphone of the fourth embodiment.
Figure 17B:
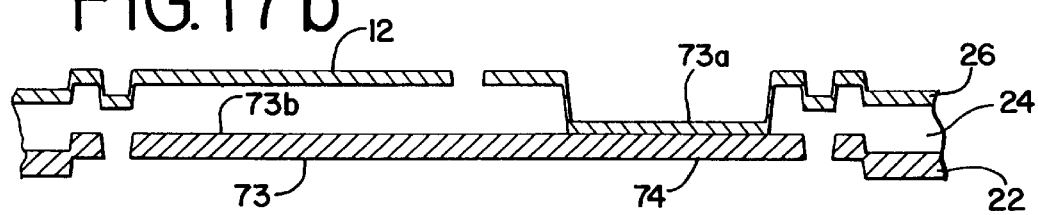

The rectangular and circular cantilevers both have a natural motion stop in one direction should the structure experience over-pressure (specifically, the narrow-gap barometric relief path and small intentional crossings of corrugation troughs and backplate film). To provide stops in the other direction, islands 73 of passivation nitride 22 are created using CMOS metal 74 as a sacrificial layer. One end 73a is attached to the edge of the diaphragm while the other end 73b is trapped under an overhang of diaphragm nitride outside of the working area. FIG. 17 shows this pressure stop structure.

Repeatability of the gap is a concern in silicon microphones. One mode of operation is to provide a high enough bias voltage to cause the diaphragm to come in contact with the backplate at the outer edge. This establishes a very repeatable gap and there is still enough compliance to provide good sensitivity.

It will be understood that the invention may be embodied in other specific forms without departing from the spirit or central characteristics thereof. The present examples and embodiments, therefore, are to be considered as illustrative and not restrictive, and the invention is not to be limited to the details given herein.

We claim:

1. A solid state condensor microphone comprising:
   a semi-conductor substrate forming a support structure and having an opening;
   a thin-film cantilever structure forming a diaphragm responsive to fluid-transmitted acoustic pressure extending over a portion of the opening, the structure having a proximal end and a distal end, wherein the proximal end is attached to the support structure, and the distal end is detached from and extends over a portion of the support structure; and
   a variable gap capacitor having a movable plate and a fixed plate, wherein the movable plate is disposed on the distal end of the structure and the fixed plate is disposed on the support structure adjacent the movable plate, wherein said condenser microphone produces an output proportional to the position of the movable plate relative to the fixed plate.

2. The transducer of claim 1 wherein said semi-conductor substrate is silicon.

3. The transducer of claim 1 wherein said proximal end of said cantilever structure is along an edge of said opening.

4. The transducer of claim 3 wherein said cantilever structure is generally in the form of a rectangle.

5. The transducer of claim 1 wherein said cantilever structure is formed of multiple layers of thin-films.

6. The transducer of claim 5 wherein said multiple layers of thin-films are quilted.

7. The transducer of claim 1 wherein said diaphragm includes means defining a pressure equalization path extending over a portion of said support structure for restricting airflow between opposing sides of the diaphragm.

8. The transducer of claim 1 including means for limiting travel of said diaphragm away from said support structure.

9. The transducer of claim 8 wherein said travel limiting means comprises means extending over said distal end of said diaphragm.

10. The transducer of claim 1 wherein said diaphragm distal end includes a vent.

11. The transducer of claim 10 wherein said vent comprises a plurality of holes extending through said distal portion.

12. A solid state condenser microphone comprising:
- a silicon substrate forming a support structure and having an opening;
- a multi-layer thin-film cantilever structure forming a diaphragm responsive to fluid-transmitted acoustic pressure extending over a portion of the opening, the structure having a proximal end and a distal end, wherein the proximal end is attached to the support structure, and the distal end is detached from and extends over a portion of the support structure; and
- a variable gap capacitor having a movable plate and a fixed plate, wherein the movable plate is disposed on the distal end of the structure and the fixed plate is disposed on the support structure adjacent the movable plate, wherein said condenser microphone produces an output proportional to the position of the movable plate relative to the fixed plate.

13. The transducer of claim 12 wherein said proximal end of said cantilever structure is along an edge of said opening.

14. The transducer of claim 13 wherein said cantilever structure is generally in the form of a rectangle.

15. The transducer of claim 12 wherein said cantilever structure is corrugated.

16. The transducer of claim 12 wherein said diaphragm includes means defining a pressure equalization path extending over a portion of said support structure for restricting airflow between opposing sides of the diaphragm.

17. The transducer of claim 12 including means for limiting travel of said diaphragm away from said support structure.

18. The transducer of claim 17 wherein said travel limiting means comprises means extending over said distal end of said diaphragm.

19. The transducer of claim 12 wherein said diaphragm distal end includes a vent.

20. The transducer of claim 12 wherein said vent comprises a plurality of holes extending through said distal end.

21. A solid state condenser microphone comprising:
- a silicon substrate support structure including a frame defining an opening and a thin-film web attached to said frame and extending across said opening;
- a thin-film cantilever forming a diaphragm responsive to fluid-transmitted acoustic pressure having a central portion and a peripheral end, wherein the central portion is attached to the web, and the peripheral end is detached from and extends over a portion of the support structure; and
- a variable gap capacitor having a movable plate and a fixed plate, wherein the movable plate is disposed on the peripheral end of the structure and the fixed plate is disposed on the support structure adjacent the movable plate wherein said condenser microphone produces an output proportional to the position of the movable plate relative to the fixed plate.

22. The transducer of claim 21 wherein said central portion of said cantilever structure is disposed in the center of said opening.

23. The transducer of claim 21 wherein said cantilever structure is generally in the form of a circle.

24. The transducer of claim 21 wherein said cantilever structure includes corrugations.

25. The transducer of claim 24 wherein said corrugations form concentric circles.

26. The transducer of claim 21 wherein said cantilever structure is quilted.

27. The transducer of claim 24 wherein said corrugations form generally radial lines.

28. The transducer of claim 24 wherein said corrugations form generally tangential lines.

* * * * *